US011215729B2

United States Patent
Al Hashim et al.

(10) Patent No.: US 11,215,729 B2
(45) Date of Patent: *Jan. 4, 2022

(54) DETERMINING PERMEABILITY VARIATION

(71) Applicant: Saudi Arabian Oil Company, Dhahran (SA)

(72) Inventors: Hassan W. Al Hashim, Dammam (SA); Jinxun Wang, Dhahran (SA); Abdulkareem AlSofi, Dhahran (SA); Amar Jaber M. Alshehri, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/922,541

(22) Filed: Jul. 7, 2020

(65) Prior Publication Data

US 2020/0333503 A1 Oct. 22, 2020

Related U.S. Application Data

(63) Continuation of application No. 16/153,994, filed on Oct. 8, 2018, now Pat. No. 10,725,198.

(51) Int. Cl.
*G01V 3/32* (2006.01)
*G01N 15/08* (2006.01)
*G01R 33/50* (2006.01)

(52) U.S. Cl.
CPC .............. *G01V 3/32* (2013.01); *G01N 15/08* (2013.01); *G01R 33/50* (2013.01)

(58) Field of Classification Search
CPC ........ G01V 3/32; G01N 15/08; G01N 24/081; G01R 33/50

(Continued)

(56) References Cited

U.S. PATENT DOCUMENTS 4,719,423 A 1/1988 Vinegar et al.
4,979,390 A * 12/1990 Schupack ............... G01M 3/04
73/38

(Continued)

OTHER PUBLICATIONS

Al-Muntasheri et al., "Gelation Kinetics and Performance Evaluation of an Organically Crosslinked Gel at High Temperature and Pressure," SPE Journal, Sep. 2008, 337-345, 8 pages.

(Continued)

*Primary Examiner* — Christopher P McAndrew
(74) *Attorney, Agent, or Firm* — Fish & Richardson P.C.

(57) ABSTRACT

Techniques for analyzing a sample include preparing a sample; circulating a gel solution through the sample to saturate the sample; scanning the saturated sample with a nuclear magnetic resonance (NMR) system to determine two or more NMR values of the saturated sample; determining a permeability of the saturated sample based, at least in part, on the two or more NMR values of the saturated sample; aging the saturated sample; scanning the aged sample with the NMR system to determine two or more NMR values of the aged sample; determining a permeability of the aged sample based, at least in part, on the two or more NMR values of the aged sample; comparing the determined permeability of the saturated sample against the determined permeability of the aged sample; and based on the compared permeabilities, determining a gel solution syneresis rate.

19 Claims, 10 Drawing Sheets

(58) Field of Classification Search
USPC .......................................................... 324/303
See application file for complete search history.

(56) References Cited

U.S. PATENT DOCUMENTS

| | | | |
|---|---|---|---|
| 5,387,865 | A | 2/1995 | Jerosch-Herold et al. |
| 2012/0273193 | A1* | 11/2012 | Sen ...................... G01N 24/081 166/250.01 |
| 2016/0305922 | A1* | 10/2016 | Narang .................. G01N 13/00 |
| 2017/0285122 | A1* | 10/2017 | Kaditz ................. G01R 33/448 |

OTHER PUBLICATIONS

Al-Muntasheri et al., "Viscoelastic properties of a high temperature cross-linked water shut-off polymeric gel," Journal of Petroleum Science and Engineering, Apr. 2006, 55:56-66, 10 pages.

Bryant et al., "Influence of Syneresis on Permeability Reduction by Polymer Gels," Society of Petroleum Engineers, Jun. 1, 2008, 7 pages.

Chang et al., "Effective Porosity, Producible Fluid and Permeability in Carbonate from Nmr Logging," Society of Petrophysicists and Well-Log Analysts, presented at the SPWLA 35th Annual Logging Symposium, Jun. 19-22, 1994, Abstract, 2 pages.

Chen et al., "Pore-Connectivity Based Permeability Model for Complex Carbonate Formations," Society of Petrophysicists, Jan. 2008, 11 pages.

Diacomo et al., "Mechanism of Polyacrylamide Gel Syneresis Determined by C-13 NMR," SPE 11787 International Symposium on Oilfield and Geothermal Chemistry, Denver, CO, Jun. 1-3, 1983; Society of Petroleum Engineers, Inc., 1983, 8 pages.

Freedman et al., "Hydrocarbon Saturation and Viscosity Estimation From Nmr Logging in the Belridge Diatomite," Society of Petrophysicists and Well-Log Analysts, Mar. 1997, 38(2):Abstract, 2 pages.

Haddad et al., "So What is the Reservoir Permeability?" SPE 63138 Annual Technical Conference and Exhibition, Dallas, TX, Oct. 1-4, 2000; Society of Petroleum Engineers, Inc., 2000, 24 pages.

Kwak et al., "SPE-183719-MS-MS: Close Monitoring of Gel Based Conformance Control by NMR Techniques," Society of Petroleum Engineers, Mar. 2017, 15 pages.

Romero-Zeron et al., "SPE 86548: Characterization of Crosslinked Gel Kinetics and Gel Strength by Use of NMR," Society of Petroleum Engineers, Jun. 1, 2008, 12 pages.

Straley et al., "Core analysis by low field NMR," Society of Core Analysis, presented at the 1994 International Symposium, Sep. 12-14, 1994, 14 pages.

Sydansk, "Acrylamide-Polymer/Chromium(III)-Carboxylate Gels for Near Wellbore Matrix Treatments," SPE Advanced Technology Series, Jan. 1990, 1.1:146-152, 6 pages.

Vasquez et al., "Laboratory Evaluation of High-Temperature Conformance Olymer Systems," SPE 80904 Production and Operations Symposium, Oklahoma City, Oklahoma, Society of Petroleum Engineers, Inc., Mar. 22-25, 2003, 11 pages.

Yao et al., "Petrophysical characterization of coals by low-field nuclear magnetic resonance (NMR)," Fuel, Jul. 2010, 89(7), 10 pages.

PCT International Search Report and Written Opinion in International Appln. No. PCT/USA2019/055136, dated Jan. 24, 2020, 18 pages.

GCC Gulf Cooperation Council Examination Report in GCC Appln. No. GC 2019-38423, dated Aug. 31, 2020, 4 pages.

* cited by examiner

400

| Core Sample | Length, cm | Diameter, cm | Pore Volume, cm³ | Porosity, fraction | Water Perm. md |
|---|---|---|---|---|---|
| 1 | 1.18 | 3.77 | 2.98 | 0.226 | 957 |
| 2 | 1.18 | 3.77 | 3.08 | 0.234 | |
| 3 | 1.55 | 3.77 | 4.04 | 0.234 | |

| Sample | Porosity fraction | $T_{1m}$ ms | $T_{2m}$ ms | $K_{NMR1}$ md | $K_{NMR2}$ md | Volumetric Average $K_{NMR1}$, md | Volumetric Average $K_{NMR2}$, md | Average $K_{NMR}$, md |
|---|---|---|---|---|---|---|---|---|
| 1 | 0.217 | 1502.25 | 443.9 | 683 | 729 | 1017 | 880 | 948 |
| 2 | 0.225 | 2145.76 | 720 | 1496 | 1123 | | | |
| 3 | 0.219 | 1638.55 | 533 | 907 | 810 | | | |

| Sample | $K_{NMR2}$ before* md | Aging time day | Porosity fraction | $T_{1m}$ ms | $T_{2m}$ ms | $K_{NMR}$ md |
|---|---|---|---|---|---|---|
| 1 | 759 | 1 | 0.157 | 115.8 | 86.2 | 74.2 |
| 2 | 950 | 3 | 0.025 | 21.101 | 12.47 | 0.2 |
| 3 | 858 | 5 | 0.218 | 222.82 | 168.3 | 320.44 |

FIG. 4C

DETERMINING PERMEABILITY VARIATION

CROSS-REFERENCE TO RELATED PATENT APPLICATIONS

This application is a continuation of and claims the benefit of priority to U.S. patent application Ser. No. 16/153,994, filed Oct. 8, 2018, the contents of which are incorporated by reference herein.

TECHNICAL FIELD

The present disclosure relates to systems and methods for determining permeability variation of geologic formation rocks, more particularly, determining permeability variation of formation core samples after gel treatment through low field nuclear magnetic resonance (NMR) measurements.

BACKGROUND

Conformance improvement by polymer gel treatment is a common practice to improve oil recovery from a heterogeneous hydrocarbon-bearing reservoir. When a gel solution that includes a water-soluble polymer and cross-linker is injected through injection wells, gel will be formed in the hydrocarbon reservoir after a certain time. As a result, any subsequent injection water will be diverted to un-swept or less-swept regions of the formation. In water shutoff applications, a gel may be injected through one or more production wells to block or reduce unwanted excess water or gas production or both.

When a gel solution solidifies inside reservoir rock, pore sizes of the rock will be reduced and the pore throats will be clogged. There will be, therefore, a reduction in the regional permeability where the gel invades, and the flow diverting or blocking purpose is then achieved. But after a certain time, gel may undergo syneresis and release water out of the gel system. The rate of gel syneresis may depend on the specific gel composition and usually accelerates with an increase in temperature. Gel strength is greatly reduced and rock permeability will gradually restore.

Coreflooding experiments have been used to measure the permeability variation for gel performance evaluation, but injection pressure may be a detriment in gel strength or integrity. Also, coreflooding is time consuming, and a long term evaluation may take months. Coreflooding may also cause some safety concerns if the coreflooding system is kept at high pressure (for example, greater than 3,000 psi) and high temperature (for example, greater than 220° F.) conditions for a lengthy duration of time.

SUMMARY

In a general implementation, a method for analyzing a formation rock core sample includes preparing a formation rock core sample; circulating a gel solution through the formation rock core sample to saturate the prepared formation rock core sample; scanning the saturated formation rock core sample with a nuclear magnetic resonance (NMR) system to determine two or more NMR values of the saturated formation rock core sample; determining a permeability of the saturated formation rock core sample based, at least in part, on the two or more NMR values of the saturated formation rock core sample; aging the saturated formation rock core sample; scanning the aged formation rock core sample with the NMR system to determine two or more NMR values of the aged formation rock core sample; determining a permeability of the aged formation rock core sample based, at least in part, on the two or more NMR values of the aged formation rock core sample; comparing the determined permeability of the saturated formation rock core sample against the determined permeability of the aged formation rock core sample; and based on the compared permeabilities, determining a gel solution syneresis rate.

An aspect combinable with the general implementation further includes scanning the prepared formation rock core sample with the NMR system to determine two or more NMR values of the prepared formation rock core sample; and determining a permeability of the prepared formation rock core sample based, at least in part, on the two or more NMR values of the prepared formation rock core sample.

In an aspect combinable with any of the previous aspects, preparing the rock sample includes coreflooding the formation rock core sample with a liquid.

In an aspect combinable with any of the previous aspects, the liquid includes water.

In an aspect combinable with any of the previous aspects, the prepared formation rock core sample includes a plurality of core sample sections.

In an aspect combinable with any of the previous aspects, preparing the formation rock core sample includes aligning the plurality of core sample sections in series.

In an aspect combinable with any of the previous aspects, aging the saturated formation rock core sample includes heating the saturated formation rock core sample.

In an aspect combinable with any of the previous aspects, heating the saturated formation rock core sample includes heating a first core sample section for a first time duration at a first temperature greater than an ambient temperature; and heating a second core sample section for a second time duration at a second temperature greater than the ambient temperature.

In an aspect combinable with any of the previous aspects, the second time duration is different than the first time duration, and the second temperature is different than the first temperature.

In an aspect combinable with any of the previous aspects, the two or more NMR values of the saturated formation rock core sample include a longitudinal decay time ($T_1$) value and a transverse decay time ($T_2$) value of the saturated formation rock core sample.

In an aspect combinable with any of the previous aspects, the two or more NMR values of the aged formation rock core sample include a $T_1$ value and a $T_2$ value of the aged formation rock core sample.

In an aspect combinable with any of the previous aspects, determining the permeability of the saturated formation rock core sample based, at least in part, on the two or more NMR values of the saturated formation rock core sample includes determining a first permeability correlation of the saturated formation rock core sample based on the $T_1$ value; determining a second permeability correlation of the saturated formation rock core sample based on the $T_2$ value; and determining the permeability of the saturated formation rock core sample based on the first and second permeability correlations of the saturated formation rock core sample.

In an aspect combinable with any of the previous aspects, determining the permeability of the saturated formation rock core sample based on the first and second permeability correlations includes determining the permeability of the saturated formation rock core sample based on an average value between the first and second permeability correlations of the saturated rock formation.

In an aspect combinable with any of the previous aspects, determining the permeability of the aged formation rock core sample based, at least in part, on the two or more NMR values of the aged formation rock core sample includes determining a first permeability correlation of the aged formation rock core sample based on the $T_1$ value; determining a second permeability correlation of the aged formation rock core sample based on the $T_2$ value; and determining the permeability of the aged formation rock core sample based on the first and second permeability correlations of the aged formation rock core sample.

In an aspect combinable with any of the previous aspects, determining the permeability of the aged formation rock core sample based on the first and second permeability correlations includes determining the permeability of the aged formation rock core sample based on an average value between the first and second permeability correlations of the aged rock formation.

In another general implementation, a system for analyzing a formation rock core sample a formation rock core sample preparation system configured to prepare a formation rock core sample; a nuclear magnetic resonance (NMR) system configured to support the prepared formation rock core sample; and a control system communicably coupled to the formation rock core sample preparation system and the NMR system. The control system is configured to perform operations including operating the formation rock core sample preparation system to circulate a gel solution through the formation rock core sample to saturate the prepared formation rock core sample; operating the NMR system to scan the saturated formation rock core sample to determine two or more NMR values of the saturated formation rock core sample; determining a permeability of the saturated formation rock core sample based, at least in part, on the two or more NMR values of the saturated formation rock core sample; operating the NMR system to scan a post-aged, saturated formation rock core sample to determine two or more NMR values of the post-aged, saturated formation rock core sample; determining a permeability of the post-aged, saturated formation rock core sample based, at least in part, on the two or more NMR values of the post-aged, saturated formation rock core sample; comparing the determined permeability of the saturated formation rock core sample against the determined permeability of the post-aged, saturated formation rock core sample; and based on the compared permeabilities, determining a gel solution syneresis rate.

In an aspect combinable with the general implementation, the control system is configured to perform operations further including operating the NMR system to scan the prepared formation rock core sample to determine two or more NMR values of the prepared formation rock core sample; and determining a permeability of the prepared formation rock core sample based, at least in part, on the two or more NMR values of the prepared formation rock core sample.

In an aspect combinable with any of the previous aspects, the control system is configured to perform operations further including operating the formation rock core sample preparation system to coreflood the formation rock core sample with a liquid.

In an aspect combinable with any of the previous aspects, the liquid includes water.

In an aspect combinable with any of the previous aspects, the prepared formation rock core sample includes a plurality of core sample sections.

In an aspect combinable with any of the previous aspects, the prepared formation rock core sample includes the plurality of core sample sections aligned in series to form the prepared formation rock core sample.

An aspect combinable with any of the previous aspects further includes an oven.

In an aspect combinable with any of the previous aspects, the control system is configured to perform operations further including operating the oven to heat the saturated formation rock core sample to form the post-aged, saturated formation rock core sample.

In an aspect combinable with any of the previous aspects, the control system is configured to perform operations further including operating the oven to heat a first core sample section for a first time duration at a first temperature greater than an ambient temperature; and operating the oven to heat a second core sample section for a second time duration at a second temperature greater than the ambient temperature.

In an aspect combinable with any of the previous aspects, the second time duration is different than the first time duration, and the second temperature is different than the first temperature.

In an aspect combinable with any of the previous aspects, the two or more NMR values of the saturated formation rock core sample include a longitudinal decay time ($T_1$) value and a transverse decay time ($T_2$) value of the saturated formation rock core sample, and the two or more NMR values of the aged formation rock core sample include a $T_1$ value and a $T_2$ value of the aged formation rock core sample.

In an aspect combinable with any of the previous aspects, the control system is configured to perform operations further including determining a first permeability correlation of the saturated formation rock core sample based on the $T_1$ value; determining a second permeability correlation of the saturated formation rock core sample based on the $T_2$ value; and determining the permeability of the saturated formation rock core sample based on the first and second permeability correlations of the saturated formation rock core sample.

In an aspect combinable with any of the previous aspects, determining the permeability of the saturated formation rock core sample based on the first and second permeability correlations includes determining the permeability of the saturated formation rock core sample based on an average value between the first and second permeability correlations of the saturated rock formation.

In an aspect combinable with any of the previous aspects, the control system is configured to perform operations further including determining a first permeability correlation of the aged formation rock core sample based on the $T_1$ value; determining a second permeability correlation of the aged formation rock core sample based on the $T_2$ value; and determining the permeability of the aged formation rock core sample based on the first and second permeability correlations of the aged formation rock core sample.

In an aspect combinable with any of the previous aspects, determining the permeability of the aged formation rock core sample based on the first and second permeability correlations includes determining the permeability of the aged formation rock core sample based on an average value between the first and second permeability correlations of the aged rock formation.

Implementations according to the present disclosure may include one or more of the following features. For example, implementations according to the present disclosure may provide for gel characterization and in situ performance evaluation through a convenient and cost effective technique relative to conventional techniques such as coreflooding. As another example, implementations according to the present disclosure may account for interactions between the gel and formation rock in contrast to the common practice of evaluating bulk gel only. As yet another example, implementations according to the present disclosure may not mechanically disturb the gel performance during testing because NMR is a non-intrusive and non-destructive method, thus providing for more accurate performance evaluation.

The details of one or more implementations of the subject matter described in this disclosure are set forth in the accompanying drawings and the description. Other features, aspects, and advantages of the subject matter will become apparent from the description, the drawings, and the claims.

BRIEF DESCRIPTION OF THE DRAWINGS

FIG. 4A illustrates a table of properties of a formation rock core sample used in the example process of FIG. 3.

FIG. 4B illustrates a table of calculated results of a formation rock core sample used in the example process of FIG. 3.

FIG. 4C illustrates another table of calculated results of a formation rock core sample used in the example process of FIG. 3

DETAILED DESCRIPTION

The present disclosure describes example implementations systems and processes for evaluating polymer gel in situ performance by a low field nuclear magnetic resonance (NMR) (for example, NMR not conducted in superconducting high-field magnets and NMR conducted in magnetic fields of a few tesla to zero tesla) technique. In some aspects, example implementations may provide a non-intrusive, non-destructive method to determine permeability variation by conducting NMR measurements during a gelling process. For instance, the NMR may be used to detect a response of hydrogen protons in a magnetic field. A property of hydrogen known as spin causes hydrogen protons to act as small bars in the presence of an external magnetic field. The protons will line either parallel or orthogonal to the external field lines of force. The protons are then forced to jump into another plane known as a transverse plane. The characteristic time can be either a time for the signal to return to its equilibrium value in the direction of the external field ($T_1$) or a time for the signal to disappear in the transverse plane ($T_2$).

From one or more data values from an NMR log, including NMR porosity ($\Phi$), longitudinal decay time ($T_1$), or transverse decay time ($T_2$), or a combination thereof, a permeability can be determined by a corebased correlation based on petrophysical studies on the specific reservoir rocks. By monitoring a variation of pore-body size distribution in a core sample saturated with a gel solution, a variation in permeability is determined and the gel performance is evaluated at different stages after gel treatment. In situ interactions between the gelling system and rock surfaces or pore structures may be accounted for in this non-intrusive, non-destructive technique, which eliminates any mechanical disturbance on gel performance.

In some implementations, specific theoretical core-based correlations provide for a qualitative estimation of permeability. The pore space reduction or restoration (or both) after gel treatment may be correlated with the variations in longitudinal decay time ($T_1$) and transverse decay time ($T_2$). Therefore, example implementations may provide a qualitative mean of predicting polymer gel treatment effectiveness and syneresis rate through NMR measurements ($\Phi$, $T_1$, $T_2$) over a period of time. Described implementations may therefore provide qualitative estimate of polymer gel effectiveness by accounting for surface interaction between the gel system and reservoir rock and eliminating mechanical disturbance on gel performance as in coreflooding, while being convenient, cost effective, and nonintrusive.

Figure 1:
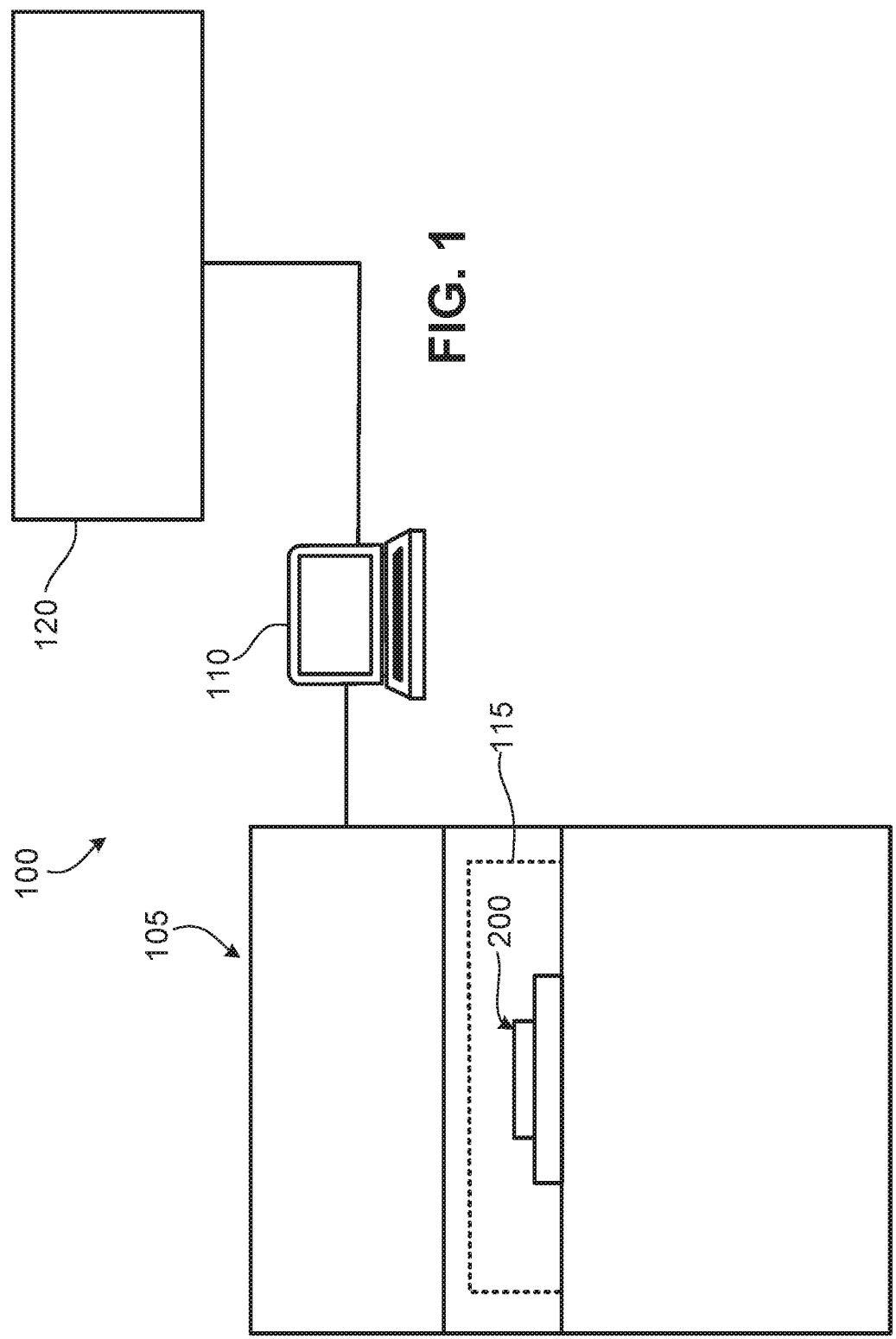
FIG. 1 shows a block diagram of an example gel solution analysis system according to the present disclosure.

FIG. 1 shows a block diagram of an example gel performance evaluation system 100. Generally, the system 100 may be operated to evaluate the gel in situ performance in core (for example, gelation time, gel strength and gel syneresis). As shown in FIG. 1, the gel performance evaluation system 100 includes a nuclear magnetic resonance (NMR) system designed to hold and analyze a formation rock core sample assembly 200 (core sample assembly 200). A control system 110 (for example, a microprocessor-based control system, such as a processor-based computing device) is communicably coupled to the NMR system 105. In some aspects, the control system 110 may be a part of, and integrated with, the NMR system 105.

The example NMR system 105 may be operated (for example, by the control system 110) to determine several NMR values. For example, the NMR system 105 may determine values of the core sample assembly 200 such as longitudinal decay time ($T_1$), transverse decay time ($T_2$), and NMR porosity ($\Phi$). Generally, the NMR system 105 uses NMR spectroscopy and is an analytical chemistry technique used for determining content and purity of a material sample such as a core sample, as well as a molecular structure. For example, NMR can quantitatively analyze mixtures containing known compounds and determine molecular conformation in solution as well as studying physical properties at the molecular level. Generally, NMR analysis relies on the principles that many nuclei (in a material) have spin and all nuclei are electrically charged. By applying an external magnetic field, an energy transfer is possible between the base energy to a greater energy level (generally a single energy gap). The energy transfer takes place at a wavelength that corresponds to radio frequencies and when the spin returns to its base level, energy is emitted at the same frequency. The signal that matches this transfer is measured and processed in order to yield an NMR spectrum for the nucleus of the atoms that comprise the analyzed material.

As shown in this example, a core sample preparation system 115 may be part of or combined with the NMR system 105. Of course, in alternative aspects, the NMR system 105 may be part of, or integrated with, the core sample preparation system 115. In this implementation, the core sample preparation system 115 is a coreflooding system. Generally, coreflooding involves injecting a fluid or combination of fluids into a sample of rock in order to, for instance, measure permeability, relative permeability, saturation change, formation damage caused by the fluid injection, or interactions between the fluid and the rock. The liquid is typically either a simulated formation brine, oil (either crude oil or refined oil), or a combination of brine and oil. Injected fluids may include crude oil, simulated reservoir brine, refined fluids, drilling mud filtrate, acids, foam or other chemicals used in the oil field, such as a gel solution. Conditions may be either ambient temperature and low confining pressure (for example, less than 1,000 psi) or high temperature (for example, greater than 220° F.) and high pressure (for example, greater than 3,000 psi) of a particular reservoir formation. Pressures and flow rates at both ends of the core are measured, and the core can also be measured with the NMR system 105.

In the illustrated implementation of system 100, the control system 110 is also communicably coupled to and configured to operate a heating device 120, such as an oven. In some implementations, as described later, the core sample assembly 200 may be "aged" to simulate conditions in a subterranean zone, such as a hydrocarbon bearing reservoir. For instance, the heating device 120 may apply a specified temperature (for example, hydrocarbon reservoir temperature) to the core sample assembly 200 to simulate such downhole conditions.

Figure 2:
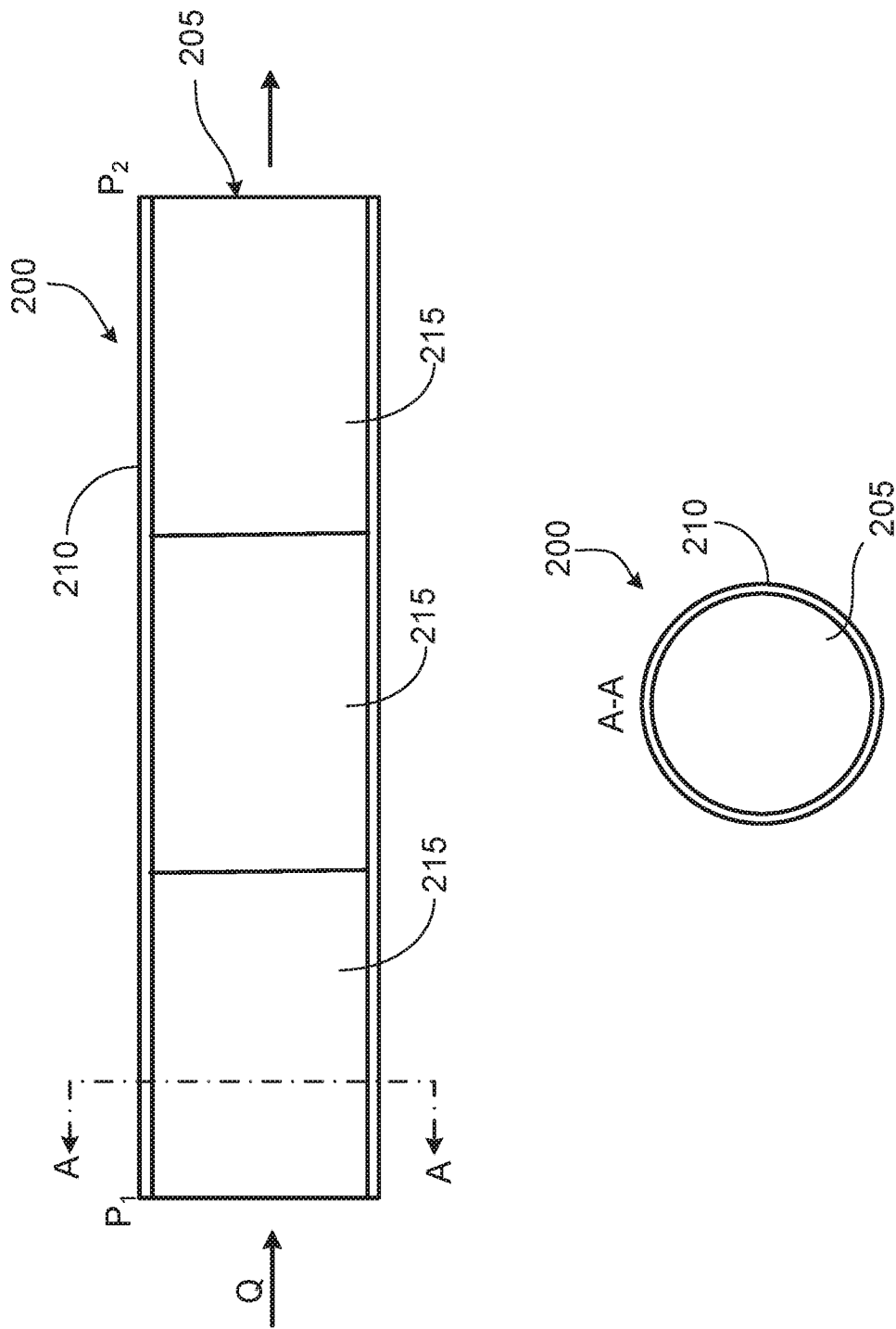
FIG. 2 shows a schematic illustration of a formation rock core sample according to the present disclosure.

FIG. 2 (which includes a side view and cross-section "A-A" view) shows schematic illustrations (a lengthwise cross-section and radial cross-section) of the formation rock core sample assembly 200. As shown in FIG. 2, the core sample assembly 200 includes a core sample 205 of a rock formation that is encased by a core sample sleeve 210. As shown in this example, the core sample 205 (and generally, the core sample assembly 200) is cylindrical in nature, with a circular or substantially circular cross-section in a radial direction. As further shown in FIG. 2, the core sample 205 may be split lengthwise into multiple core sample sections 215 (in this example, three sections 215). Alternatively, the core sample 205 may be a single-piece structure, or split into two or more than three sections 215.

FIG. 2 shows an example of a fluid circulated through the core sample assembly 200. The fluid, which may be circulated through the core sample 205 at a flow rate, Q, may be for example, water (brine or fresh), as well as a gel solution, as described with reference to FIG. 3, as part of a process for determining permeability and saturating the core sample with gel solution. Inlet and outlet of the core sample assembly 200, as indicated by pressures, $P_1$ and $P_2$, in FIG. 2, are monitored during fluid injection (for example, which are then used to calculate permeability).

Figure 3:
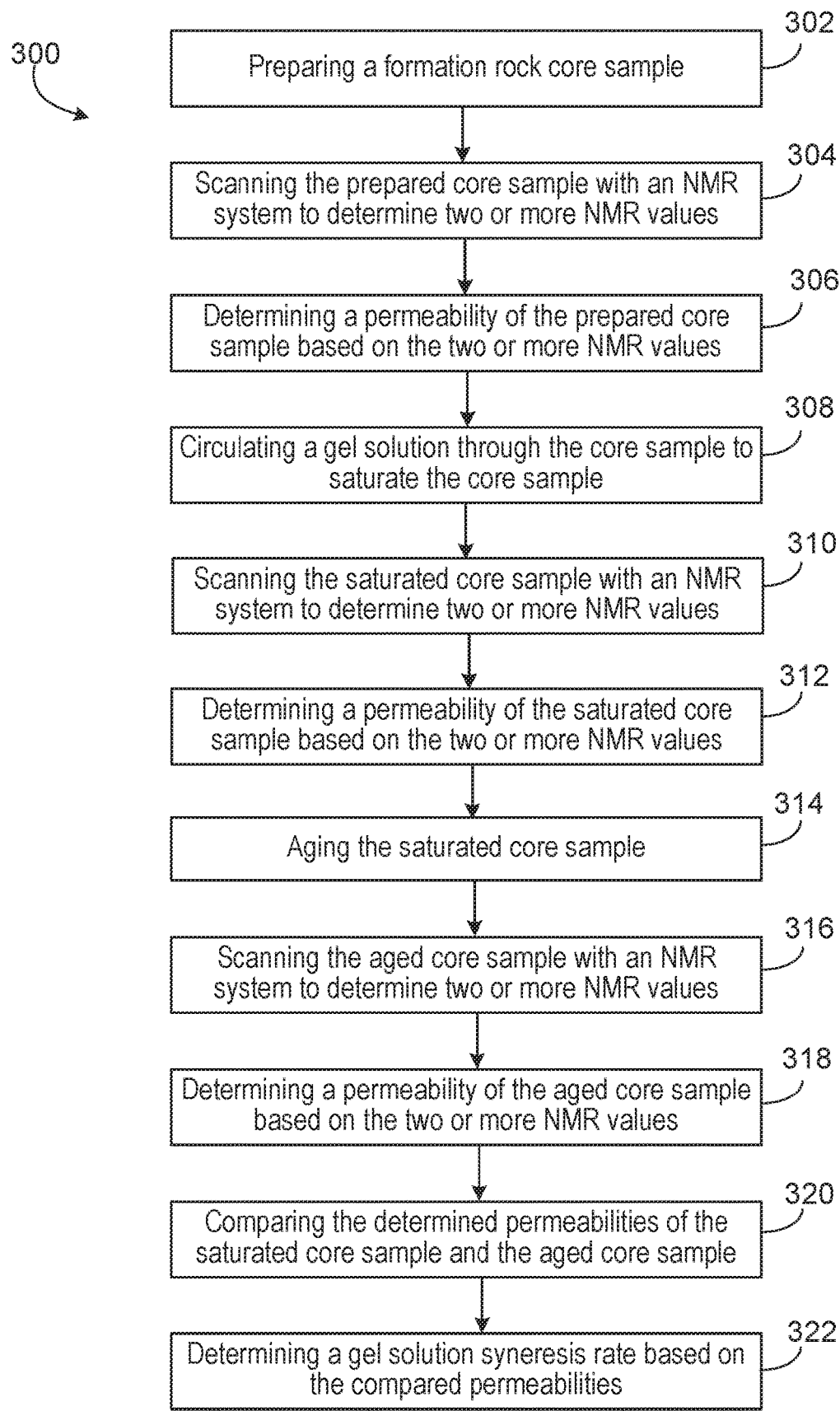
FIG. 3 illustrates a flowchart for an example process for determining gel solution performance according to the present disclosure

FIG. 3 illustrates a flowchart for an example process 300 for determining gel in situ performance in core samples. In some implementations, the process 300 may be performed by or with the gel performance evaluation system 100 shown in FIG. 1. Alternatively, process 300 may be performed by or with another system capable of executing the steps of the process.

Process 300 may begin at step 302, which includes preparing a formation rock core sample. In some implementations, preparing the core sample (such as core sample 205) may include separating the sample into multiple (for example 2 or more) core sample sections (such as sections 215). The preparation may also include aligning the sections end-to-end (in other words, in series) and encasing the core sample sections into a sleeve, such as the sleeve 210 shown in FIG. 2. As further examples of preparation, the core sample may be saturated with a first liquid, such as water. The core sample may therefore be coreflooded with the water as part of step 302. Further, the liquid may be forced to saturate the core sample with an application of pressure to the sample as part of step 302.

Figure 5:
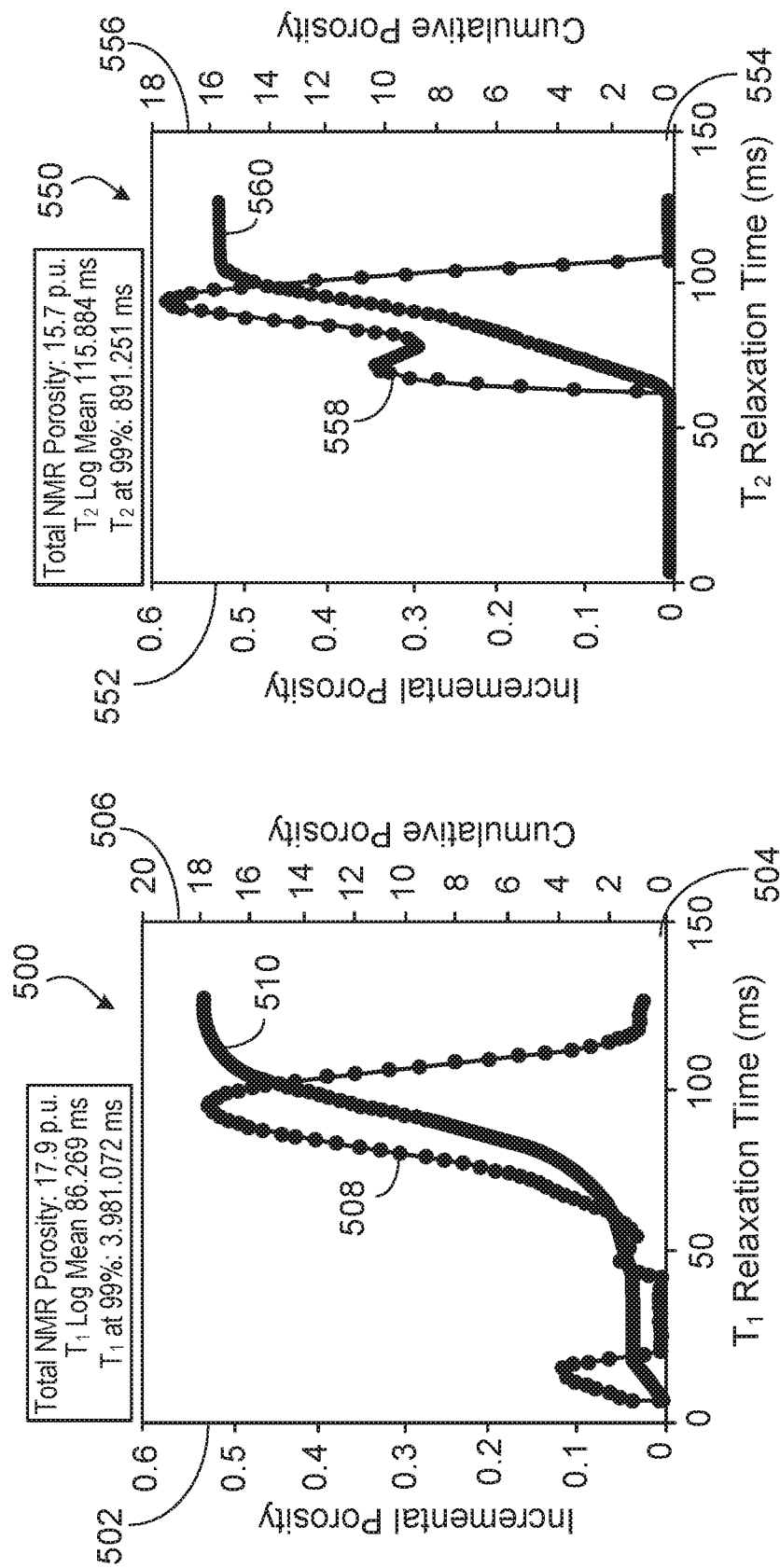
FIGS. 5-9 illustrate graphs of NMR data taken from the analysis of a formation rock core sample used in the example process of FIG. 3.
Figure 6:
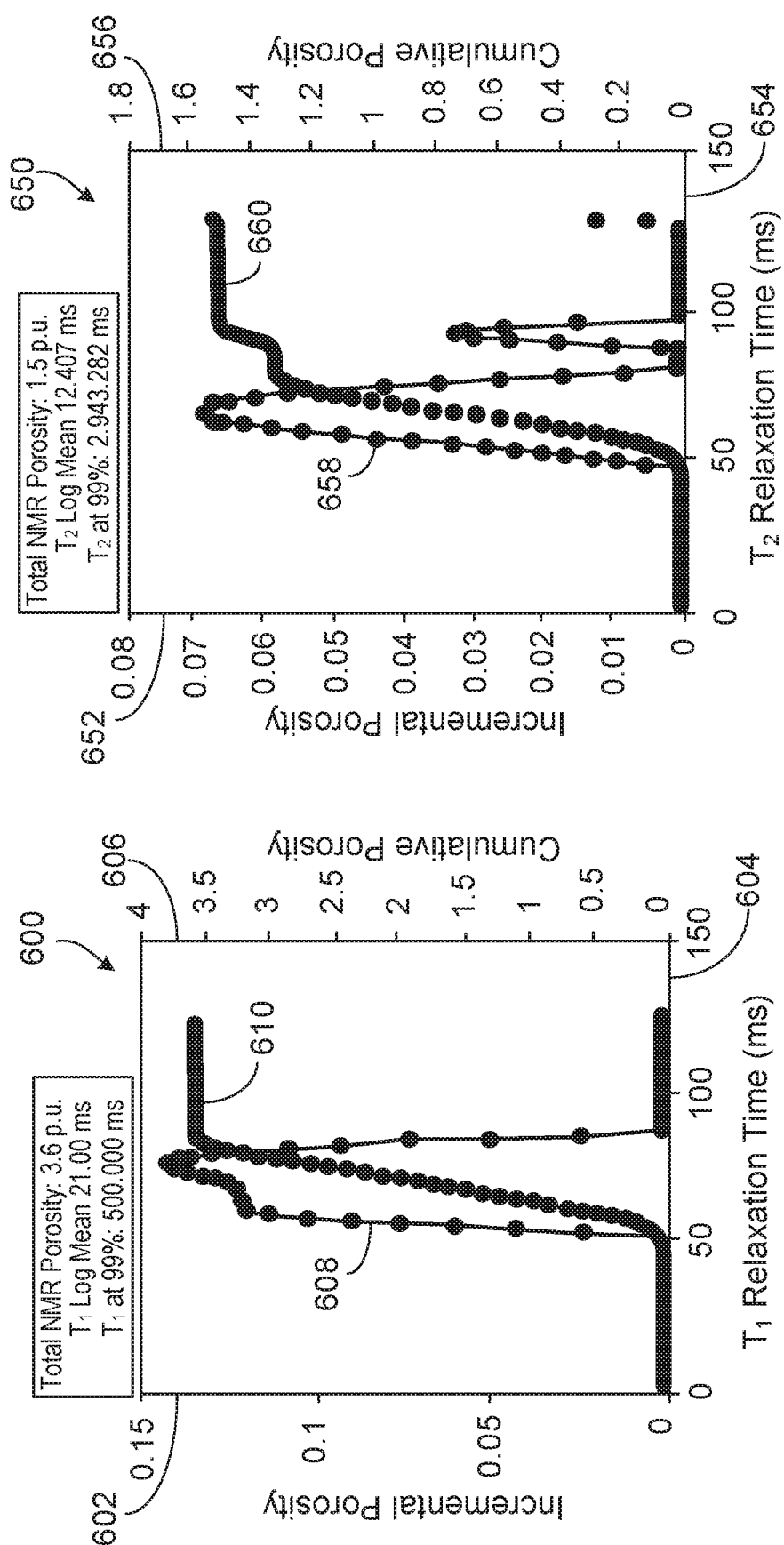
Figure 7:
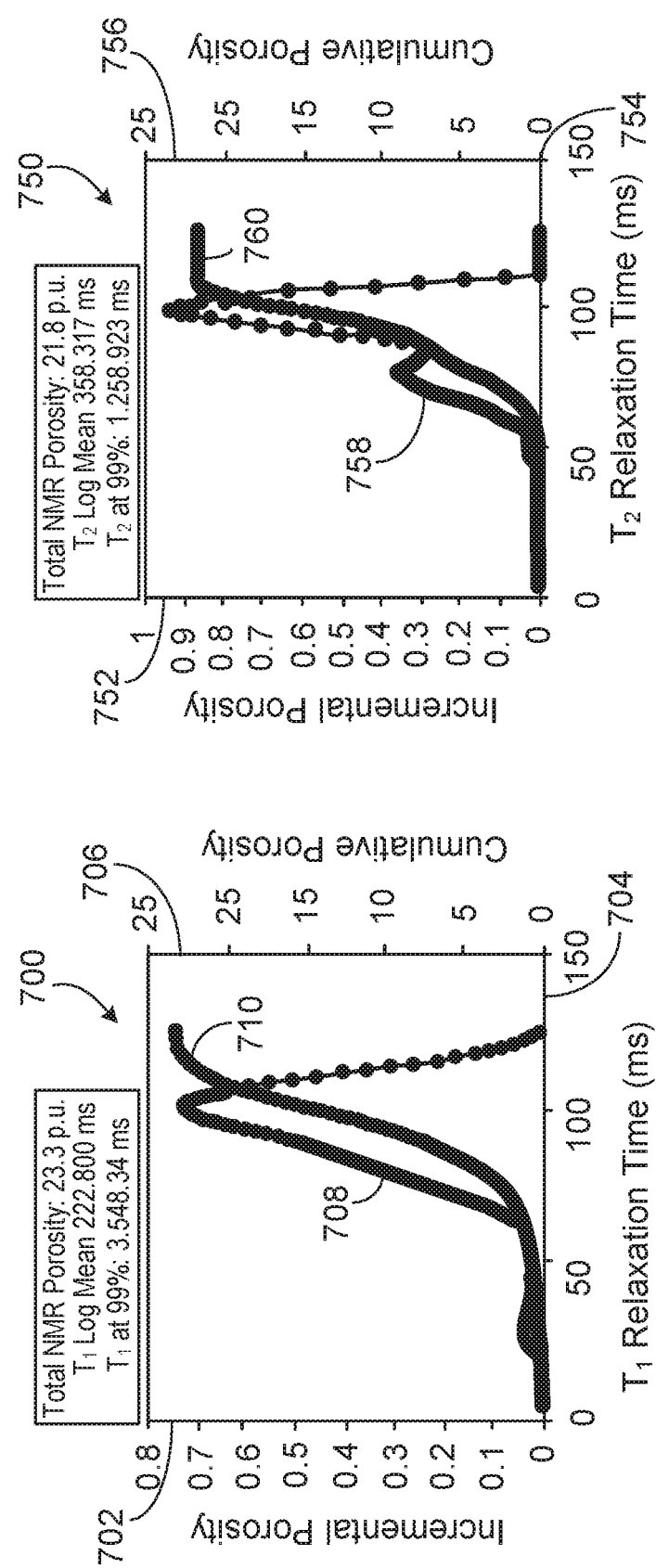

Process 300 may continue at step 304, which includes scanning the prepared core sample with an NMR system to determine two or more NMR values. For example, step 304 may include conducting NMR $T_2$ measurement on the prepared core sample (for example, saturated with water) to determine porosity and $T_2$ relaxation time. Step 304 may include conducting NMR $T_1$ measurement to determine porosity and $T_1$ relaxation time. In some aspects, $T_2$ and $T_1$ measurements are conducted separately, and $T_2$ measurement may be more common because $T_1$ measurement is more time consuming. As shown in FIGS. 5 to 7, $T_2$ measurement can give results of porosity and $T_2$ relaxation time, and $T_1$ measurement can give results of porosity and $T_1$ relaxation time. Permeability can be calculated from either the results of $T_2$ measurement or the results of $T_1$ measurement.

Process 300 may continue at step 306, which includes determining a permeability of the prepared core sample based on the NMR results. For example, a permeability of the prepared core sample, which in this example may be saturated with water, may be determined as an initial or baseline determination of permeability. In some aspects, permeability may be determined by multiple permeability correlations, as shown in Equations 1 and 2:

$$K = 12*(\Phi^{2.1}*T_1 m)^{1.4} \tag{1}$$

$$K = 12*(\Phi^{2.1}*T_2 m)^{1.28} \tag{2}$$

In Equations 1 and 2, K is permeability in millidarcies, $T_{1m}$ is longitudinal decay time in milliseconds (determined by the NMR system), $T_{2m}$ is transverse decay time in milliseconds (determined by the NMR system), and $\Phi$ is NMR porosity (determined by the NMR system). In Equations 1 and 2, permeability was expressed as functions of $T_1$ and $T_2$ separately, and increases with porosity and both $T_1$ and $T_2$. In these equations, the constants (in other words, 2.1, 1.4, and 1.28) are tuned to match the measured water saturated permeability of the core sample.

In some aspects, determining the permeability includes determining an average of the K values correlated by Equations 1 and 2. Alternatively, a K value of a particular one of Equations 1 or 2 may be used as the permeability value.

Process 300 may continue at step 308, which includes circulating a gel solution through the core sample to saturate the core sample. For example, a prepared gel solution for which performance evaluation (in other words, syneresis rate) is desired may be circulated through the core sample by the core sample preparation system 115. Further, as in step 302, pressure may be applied to the core sample during (or after) circulation of the gel solution through the core sample to ensure saturation of the core sample with the gel solution.

Process 300 may continue at step 310, which includes scanning the saturated core sample with an NMR system to determine two or more NMR values. For example, much like step 304, the saturated core sample (saturated with gel solution) may be analyzed by the NMR system 105 of system 100 to determine NMR values, such as NMR porosity and $T_1$ relaxation time, or NMR porosity and $T_2$ relaxation time.

Process 300 may continue at step 312, which includes determining a permeability of the saturated core sample based on the two or more NMR measurement results. For example, using Equations 1 and 2, permeability may be determined by multiple permeability correlations. Next, a single permeability value of the saturated core sample may be determined, for example, by selecting one of the two calculated K values, averaging the two calculated K values, or otherwise combining the correlated K values into a single value.

Process 300 may continue at step 314, which includes aging the saturated core sample. For example, in some implementations, aging the core sample may simulate reservoir conditions in a subterranean zone (such as heat and pressure). For instance, the saturated core sample may be placed in the heating device 120, and the control system 110 may operate the heating device to heat the core sample.

In some aspects, such as when the core sample is sectioned into multiple sections, the heating device 120 may be used to heat each of the multiple core sample sections at different temperatures and for different time durations.

Process 300 may continue at step 316, which includes scanning the aged core sample with an NMR system to determine two or more NMR values. For example, much like steps 304 and 310, the aged core sample (aged in the heating device or aged without heating) may be analyzed by the NMR system 105 of system 100 to determine NMR porosity and $T_1$ relaxation time, or NMR porosity and $T_2$ relaxation time, or both.

Process 300 may continue at step 318, which includes determining a permeability of the aged core sample based on the two or more NMR measurement results. For example, using Equations 1 and 2, permeability may be determined by multiple permeability correlations for the aged core sample. Next, a single permeability value of the aged core sample may be determined, for example, by selecting one of the two calculated K values, averaging the two K values, or otherwise combining the correlated K values into a single value.

Process 300 may continue at step 320, which includes comparing the determined permeabilities of the saturated core sample (determined in step 312) and the aged core sample (determined in step 318). For example, based on differences (for example declining or inclining from the saturated core sample to the aged core sample) a comparison may be determined for the two permeability values. For example, a permeability decrease of the aged core sample may indicate gel is formed in the core. A more significant decrease in permeability may indicate the gel strength is stronger.

Process 300 may continue at step 322, which includes determining a gel solution syneresis rate based on the compared permeabilities. For example, in some cases, a permeability regain may be observed after a longer aging duration. This may indicate that the gel syneresis occurs in the core and part of water releases from the gel system. When gel is formed, permeability will decrease. For some gel systems, after a longer aging time, gel syneresis may occur which results in permeability regain.

An experiment with actual core samples ("Experiment") was performed according to the process 300 described in FIG. 3. In the Experiment, a close correlation between gel in situ performance in core and NMR interpreted permeability was shown by conducting NMR measurements at 2 megahertz (MHz) on core samples saturated with a gel solution. The pore size distribution at different stages of gelling process, including before gel, during gelation, and during gel syneresis stages, were closely monitored according to the process 300. The permeability was determined by core-based correlations based on petrophysical studies on the specific reservoir rock used in the core sample.

In the Experiment, three pieces of carbonate core sample were cut from a 1.5-inch diameter core sample. The lengths of these three core sample sections were 1.180 centimeters (cm), 1.180 cm, and 1.548 cm, respectively. The core sample sections were saturated with deionized water under vacuum conditions and then pressurized at a pressure of 2,000 pounds per square inch (psi) to ensure that the core sample was fully saturated with water. The core sample sections were put together as a composite core sample (as shown in FIG. 2), and loaded into a coreflooding system (for example, the core sample preparation system 115) to conduct water permeability measurements at ambient (for example, room) temperature. The water permeability was measured to be 957 millidarcies (md). The detailed core sample dimensions and permeability data are listed in table 400 shown in FIG. 4A. As illustrated, the core sample sections (labeled 1, 2, and 3) have the listed dimensions (length and diameter), volume (in cubic centimeters), and NMR porosity ($\Phi$) (shown as a fraction of 1).

Next in the Experiment, the three core samples were scanned using a 2 MHz NMR system (for example, NMR system 105) for the measurements of porosity ($\Phi$), longitudinal decay time ($T_1$) and transverse decay time ($T_2$). These NMR parameters were then used to estimate permeability based on the core-based correlations of Equations 1 and 2 (previously described). The constants in these equations were tuned to match the measured brine permeability of 957 md. Detailed NMR results and the calculated permeability are presented in table 405 of FIG. 4B. As shown, the core samples 1, 2, and 3, each have listed NMR porosity, $T_1$, and $T_2$ values. $K_{NMR1}$ represents the K from the correlation of Equation 1, while $K_{NMR2}$ represents the K from Equation 2. Table 405 also shows volumetric averages of both $K_{NMR1}$ and $K_{NMR2}$ for each of the three sample sections. The average permeability from $T_1$ and $T_2$ as shown in table 405 is 948 md, which is very close to the measured value of 957 md for the water saturated samples.

Next in the Experiment, a gel solution was prepared by mixing a 5,000 milligram per liter (mg/L) polymer solution with a 500 mg/L crosslinking agent solution in synthetic seawater. The polymer used in this Experiment is a copolymer of acrylamide and acrylamide tert-butyl sulfonate with a sulfonation degree of about 25% (for example, FLOPAAM™ AN125 from SNF Floerger, France). The molecular weight of the polymer was 12 million Dalton. The crosslinking agent was chromium(III), and its stock solution was prepared using chromium(III) acetate. The three core sample sections were loaded into a core holder as a composite core sample, and the gel solution was injected into core sample at room temperature. NMR measurements were then conducted on each individual gel saturated core sample section. The permeability of each core section was determined from the NMR results in the similar procedure as for determining brine permeability, and listed in the second column of Table 410 as $K_{NMR\ before}$.

After that, the core sample sections were put into a 95° C. heating device (such as heating device 120). The three different sample sections were removed from the heating device for NMR measurements at different gelling stages (for example, after different time durations in the heating device). NMR permeability of each sample section was determined as the average value of the permeabilities calculated from Equations 1 and 2. Detailed NMR results and the calculated permeability are presented in table 410 of FIG. 4C. As shown, table 410 includes $K_{NMR}$ before, which is the NMR permeability prior to aging in the heating device for each sample section. Each sample section was subjected to a different aging time as shown in table 410 (1 day for sample 1, 3 days for sample 2, and five days for sample 3).

The NMR values ($\Phi$, $T_1$, and $T_2$), as well as the determined $K_{NMR}$, are shown in table 410 for each core sample section.

Figure 9:
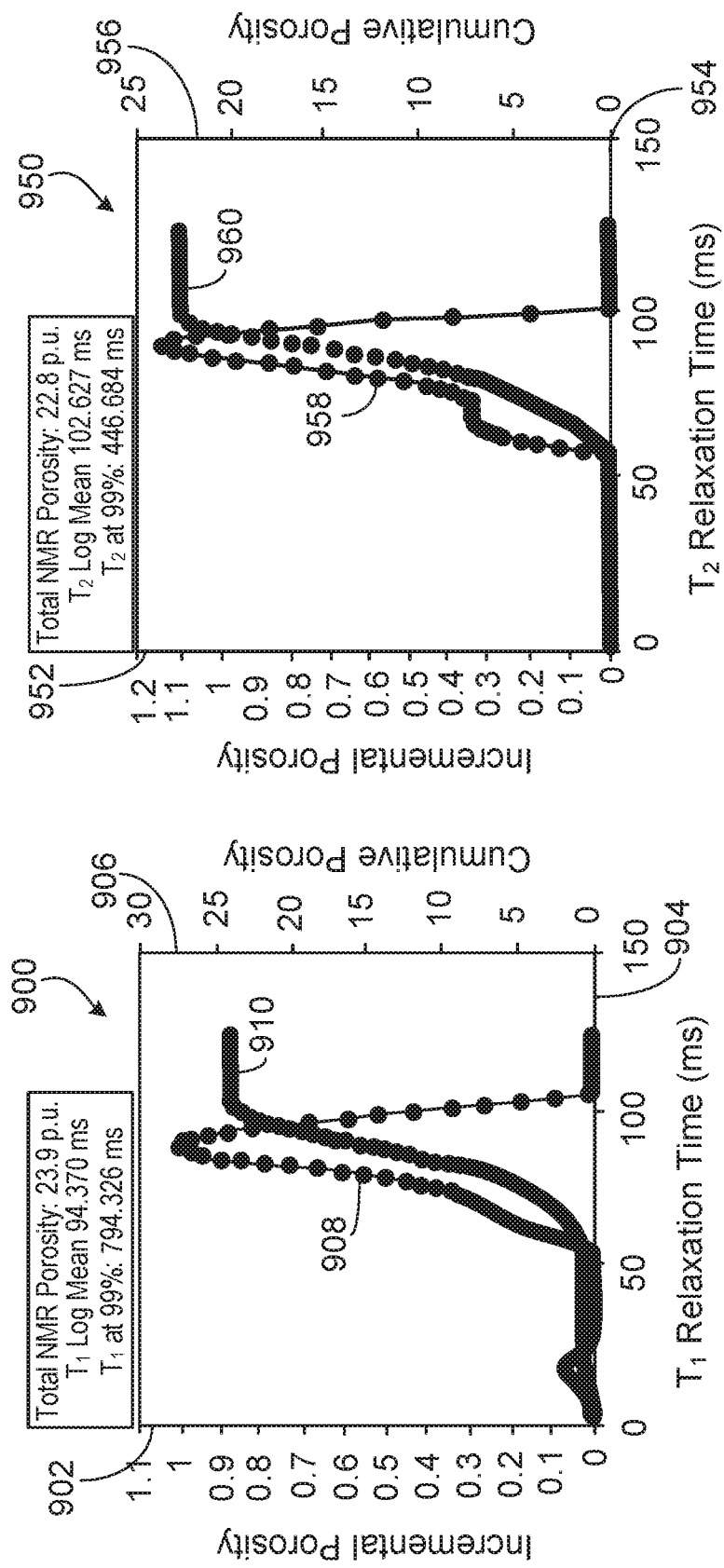

Core sample section 1 was NMR scanned after 5 hours of aging as well as 1 day of aging inside the 95° C. heating device. The NMR results showed a shift in both $T_1$ and $T_2$ from those of pre-aging values. The pore size also decreased compared to pre-aging. The NMR interpreted permeability decreased to 74.2 md after one day aging as compared to 759 md prior to aging. This indicates a change in the status of the gel system in the core sample section, which could be at the transition state from a polymer-like solution to solid-like gel. These results are shown in FIG. 5, which includes a graph 500 of incremental porosity 510 (measured on y-axis 502) and cumulative porosity 508 (measured on y-axis 506) vs. measured $T_1$ (x-axis 504), as well as a graph 550 of incremental porosity 560 (measured on y-axis 552) and cumulative porosity 558 (measured on y-axis 556) vs. measured $T_2$ (x-axis 554). Further results (taken 5 hours of aging in the heating device) are shown in FIG. 9. FIG. 9 includes a graph 900 of incremental porosity 910 (measured on y-axis 902) and cumulative porosity 908 (measured on y-axis 906) vs. measured $T_1$ (x-axis 904), as well as a graph 950 of incremental porosity 960 (measured on y-axis 952) and cumulative porosity 958 (measured on y-axis 956) vs. measured $T_2$ (x-axis 954). The shift in both responses indicates the starting of the gelation process. The pore body size distribution indicates that the gel is not solidified yet.

The results shown in FIG. 5 indicate a shift in both responses similar to the response obtained 5 hours of aging post gel injection (shown in the graphs of FIG. 9). The pore body size distribution indicates that the gelation has started and clogging some pores in the rock sample.

Core sample section 2 was NMR scanned after 3 days of aging inside the 95° C. heating device. The NMR results showed both $T_1$ and $T_2$ are shorter than those of pre-aging values. The pore size decreased significantly compared to pre-aging. The calculated permeability decreased to 1.17 md, which was significantly less than the pre-aging value of 950 md. This indicates that the gel formed in the core was more mature with high gel strength. These results are shown in FIG. 6, which includes a graph 600 of incremental porosity 610 (measured on y-axis 602) and cumulative porosity 608 (measured on y-axis 606) vs. measured $T_1$ (x-axis 604), as well as a graph 650 of incremental porosity 660 (measured on y-axis 652) and cumulative porosity 658 (measured on y-axis 656) vs. measured $T_2$ (x-axis 654). The shift in both responses is different than those obtained previously. The pore body size distribution indicates that the gel has solidified inside the core and is currently clogging major pores in the rock sample. Moreover, NMR response shows minimal water presence due to the present gel structure in the core sample.

Core sample section 3 was NMR scanned after 5 days of aging inside the 95° C. heating device. Both $T_1$ and $T_2$ were longer than those of core sample section 2, and close to the original values before aging. The pore size was also close to the original value obtained before aging. The calculated permeability was 320 md, which restored to around 41% of the original value. This indicates that the gel syneresis occurred in the core and part of water had released from the gel system. These results are shown in FIG. 7, which includes a graph 700 of incremental porosity 710 (measured on y-axis 702) and cumulative porosity 708 (measured on y-axis 706) vs. measured $T_1$ (x-axis 704), as well as a graph 750 of incremental porosity 760 (measured on y-axis 752) and cumulative porosity 758 (measured on y-axis 756) vs. measured $T_2$ (x-axis 754). The shift in both responses has changed compared to the response obtained after 3 days of gel injection. The pore body size distribution indicates that the gel started releasing some water and majority of the pores are not clogged.

Figure 8:
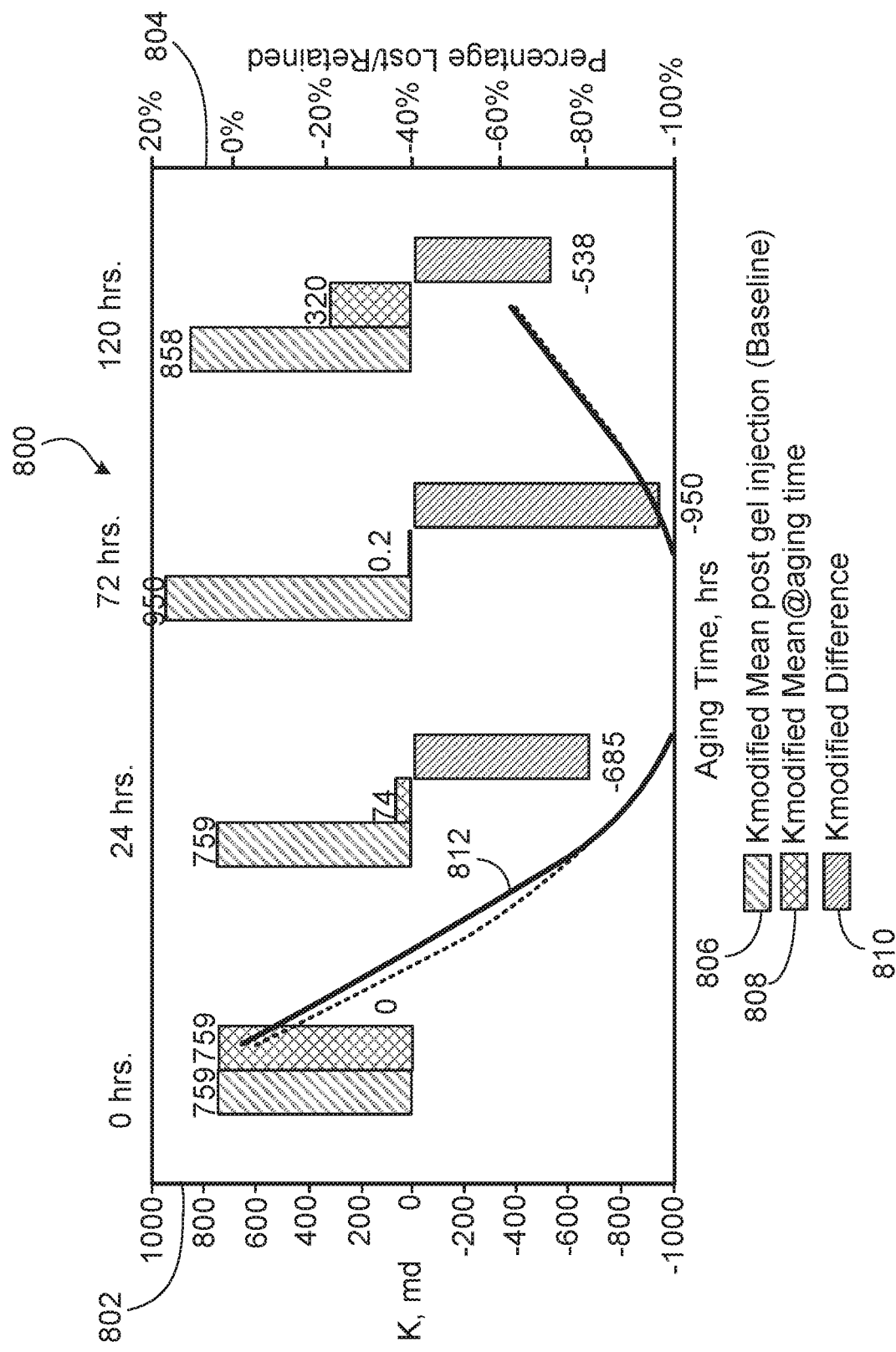

FIG. 8 is a graph 800 that shows baseline NMR permeability (measured on y-axis 802) and percentage of water and gel that is lost/retained (on y-axis 804) vs. the NMR permeability obtained at different aging stages (in hours). The bars 806 represent the baseline permeability: the NMR permeability of the gel-saturated core sample before aging. The bars 808 represent the permeability determined on the core at different durations of aging time. The bars 810 represent the decreasing in permeability after aging; the longer of the bars 810 means more significant decrease in permeability, and the gel formed in the core is stronger. The numbers for the labels of horizontal axis, 0, 24, 72 and 120, are aging time in hours. As shown in graph 800, a clear inflection point in curve 812 is noticed after 72 hours of aging at 95° C. in the heating device.

Figure 10:
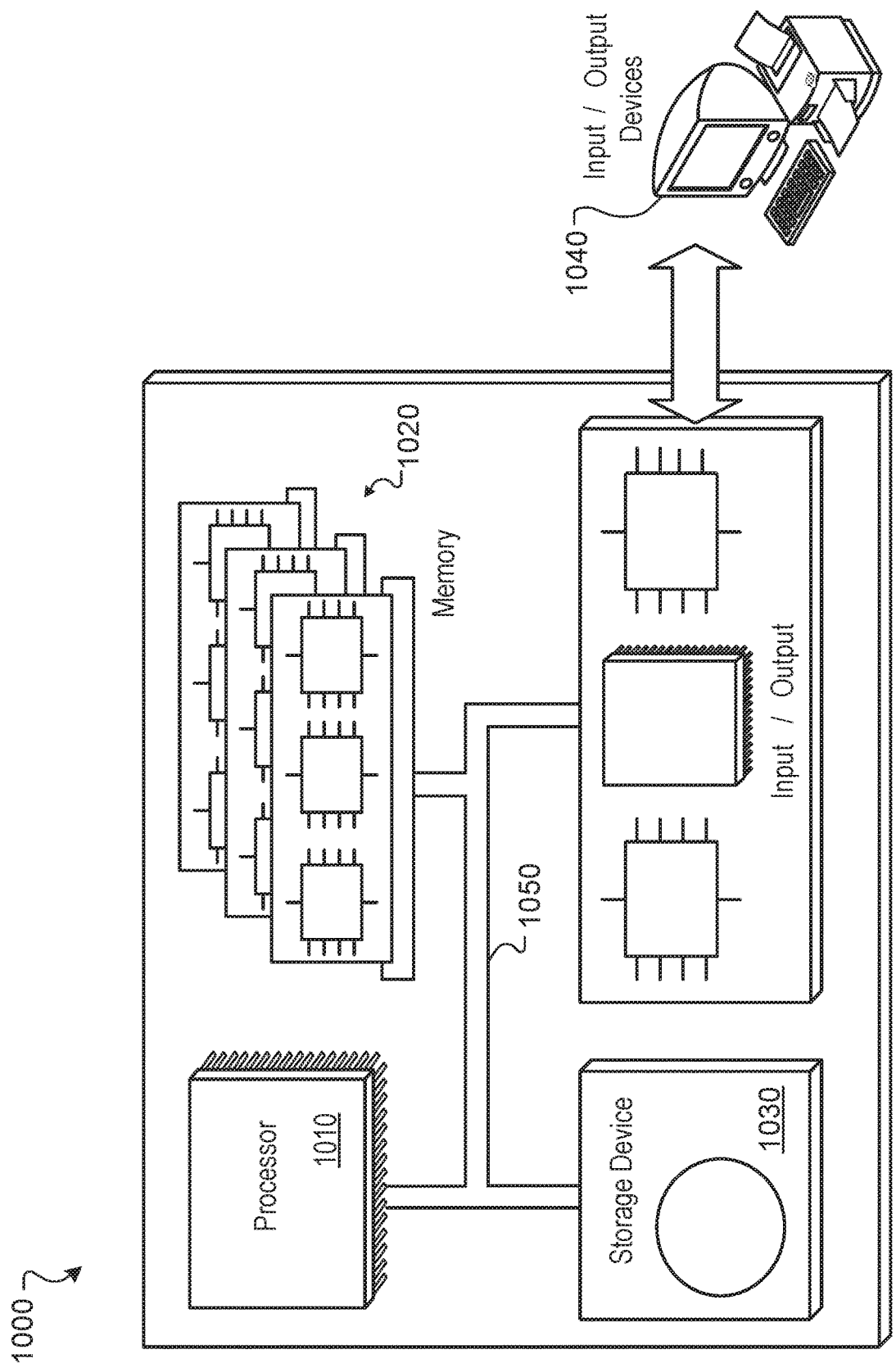
FIG. 10 is a schematic illustration of a controller or control system for a gel solution analysis system according to the present disclosure.

FIG. 10 is a schematic illustration of an example controller 1000 (or control system) for a gel solution analysis system, such as the control system 110 of gel syneresis analysis system 100. The controller 1000 is intended to include various forms of digital computers, such as printed circuit boards (PCB), processors, or digital circuitry. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1000 includes a processor 1010, a memory 1020, a storage device 1030, and an input/output device 1040. Each of the components 1010, 1020, 1030, and 1040 are interconnected using a system bus 1050. The processor 1010 is capable of processing instructions for execution within the controller 1000. The processor may be designed using any of a number of architectures. For example, the processor 1010 may be a CISC (Complex Instruction Set Computers) processor, a RISC (Reduced Instruction Set Computer) processor, or a MISC (Minimal Instruction Set Computer) processor.

In one implementation, the processor 1010 is a single-threaded processor. In another implementation, the processor 1010 is a multi-threaded processor. The processor 1010 is capable of processing instructions stored in the memory 1020 or on the storage device 1030 to display graphical information for a user interface on the input/output device 1040.

The memory 1020 stores information within the controller 1000. In one implementation, the memory 1020 is a computer-readable medium. In one implementation, the memory 1020 is a volatile memory unit. In another implementation, the memory 1020 is a non-volatile memory unit.

The storage device 1030 is capable of providing mass storage for the controller 1000. In one implementation, the storage device 1030 is a computer-readable medium. In various different implementations, the storage device 1030 may be a floppy disk device, a hard disk device, an optical disk device, a tape device, flash memory, a solid state device (SSD), or a combination thereof.

The input/output device 1040 provides input/output operations for the controller 1000. In one implementation, the input/output device 1040 includes a keyboard or pointing device (or both). In another implementation, the input/output device 1040 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor. Method steps can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as erasable programmable read-only memory (EPROM), electrically erasable programmable read-only memory (EEPROM), solid state drives (SSDs), and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of what may be claimed, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described here may include more steps or fewer steps than those described. Further, the steps in such example operations, methods, or processes may be performed in different successions than that described or illustrated in the figures. Accordingly, other implementations are within the scope of the following claims.

What is claimed is:

1. A method comprising:
saturating a formation rock core sample with a gel solution;
aging the saturated formation rock core sample;
before and after the aging:
scanning the saturated formation rock core sample with a nuclear magnetic resonance (NMR) system to determine two or more NMR values of the saturated formation rock core sample, and
determining a permeability of the saturated formation rock core sample based, at least in part, on the two or more NMR values of the saturated formation rock core sample;
comparing a determined permeability of the saturated formation rock core sample before the aging against a determined permeability of the saturated formation rock core sample after the aging; and
based on the compared permeabilities, determining a gel solution syneresis rate.

2. The method of claim 1, wherein saturating the formation rock core sample with the gel solution comprises:

preparing the formation rock core sample; and
circulating the gel solution through the formation rock core sample.

3. The method of claim 2, wherein preparing the rock sample comprises coreflooding the formation rock core sample with a liquid.

4. The method of claim 3, wherein the liquid comprises water.

5. The method of claim 2, wherein the prepared formation rock core sample comprises a plurality of core sample sections.

6. The method of claim 5, wherein preparing the formation rock core sample comprises aligning the plurality of core sample sections in series.

7. The method of claim 5, wherein aging the saturated formation rock core sample comprises heating the saturated formation rock core sample.

8. The method of claim 7, wherein heating the saturated formation rock core sample comprises:
heating a first core sample section for a first time duration at a first temperature greater than an ambient temperature; and
heating a second core sample section for a second time duration at a second temperature greater than the ambient temperature.

9. The method of claim 1, wherein the two or more NMR values of the saturated formation rock core sample comprise a longitudinal decay time ($T_1$) value and a transverse decay time ($T_2$) value of the saturated formation rock core sample before aging and after aging.

10. The method of claim 9, wherein determining the permeability of the saturated formation rock core sample based, at least in part, on the two or more NMR values of the saturated formation rock core sample comprises:
determining a first permeability correlation of the saturated formation rock core sample based on the $T_1$ value;
determining a second permeability correlation of the saturated formation rock core sample based on the $T_2$ value; and
determining the permeability of the saturated formation rock core sample based on the first and second permeability correlations of the saturated formation rock core sample.

11. The method of claim 10, wherein determining the permeability of the saturated formation rock core sample based on the first and second permeability correlations comprises determining the permeability of the saturated formation rock core sample based on an average value between the first and second permeability correlations of the saturated rock formation.

12. A system for analyzing a formation rock core sample, comprising:
a formation rock core sample preparation system configured to prepare a formation rock core sample;
a nuclear magnetic resonance (NMR) system configured to support the prepared formation rock core sample; and
a control system communicably coupled to the formation rock core sample preparation system and the NMR system and configured to perform operations comprising:
operating the formation rock core sample preparation system to saturate the formation rock core sample with a gel solution;
before and after aging the saturated formation rock core sample:
operating the NMR system to scan the saturated formation rock core sample to determine two or more NMR values of the saturated formation rock core sample;
determining a permeability of the saturated formation rock core sample based, at least in part, on the two or more NMR values of the saturated formation rock core sample;
a determined permeability of the saturated formation rock core sample before the aging against a determined permeability of the saturated formation rock core sample after the aging; and
based on the compared permeabilities, determining a gel solution syneresis rate.

13. The system of claim 12, wherein, to saturate the formation rock core sample with the gel solution, the control system is configured to perform operations further comprising operating the formation rock core sample preparation system to:
prepare the formation rock core sample; and
circulate the gel solution through the formation rock core sample.

14. The system of claim 13, wherein the control system is configured to perform operations further comprising operating the formation rock core sample preparation system to coreflood the formation rock core sample with a liquid.

15. The system of claim 14, wherein the liquid comprises water.

16. The system of claim 15, wherein the prepared formation rock core sample comprises a plurality of core sample sections.

17. The system of claim 16, wherein the prepared formation rock core sample comprises the plurality of core sample sections aligned in series to form the prepared formation rock core sample.

18. The system of claim 17, further comprising an oven, the control system configured to perform operations further comprising operating the oven to heat the saturated formation rock core sample to form the post-aged, saturated formation rock core sample.

19. The system of claim 18, wherein the control system is configured to perform operations further comprising:
operating the oven to heat a first core sample section for a first time duration at a first temperature greater than an ambient temperature; and
operating the oven to heat a second core sample section for a second time duration at a second temperature greater than the ambient temperature.

* * * * *